United States Patent
Treur

(10) Patent No.: US 6,748,961 B2
(45) Date of Patent: Jun. 15, 2004

(54) ANGULAR SPIN, RINSE, AND DRY MODULE AND METHODS FOR MAKING AND IMPLEMENTING THE SAME

(75) Inventor: Randolph E. Treur, Pismo Beach, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/823,813

(22) Filed: Mar. 30, 2001

(65) Prior Publication Data

US 2002/0139389 A1 Oct. 3, 2002

(51) Int. Cl.⁷ .................................. B08B 3/02
(52) U.S. Cl. ................. 134/148; 134/153; 134/200; 134/95.2; 134/902; 34/202
(58) Field of Search ............... 134/95.2, 199; 34/58, 202

(56) References Cited

U.S. PATENT DOCUMENTS

| | | | |
|---|---|---|---|
| 4,021,278 A | | 5/1977 | Hood et al. ................ 156/626 |
| 4,541,141 A | * | 9/1985 | Le Goff |
| 5,597,460 A | * | 1/1997 | Reynolds |
| 5,727,582 A | * | 3/1998 | Terui |
| 5,868,866 A | * | 2/1999 | Maekawa et al. |
| 5,927,305 A | | 7/1999 | Shiba .................. 134/153 |
| 6,012,192 A | | 1/2000 | Sawada et al. .............. 15/77 |
| 6,093,087 A | | 7/2000 | Hakomori et al. .......... 451/57 |
| 6,248,009 B1 | * | 6/2001 | Ito et al. |
| 6,543,080 B1 | * | 4/2003 | Tomita et al. |
| 2001/0010103 A1 | | 8/2001 | Konishi et al. ............. 15/77 |

FOREIGN PATENT DOCUMENTS

| | | | | |
|---|---|---|---|---|
| JP | 60-245136 | * | 12/1985 | |
| JP | 61-56292 | * | 3/1986 | |
| JP | 63-190678 | | 8/1988 | ........ H01L/21/30 |
| JP | 63-25627 | * | 10/1988 | |
| JP | 63-253627 | * | 10/1988 | |
| JP | 1-259536 | * | 10/1989 | |
| JP | 2-12819 | | 2/1990 | ........ H01L/21/304 |
| JP | 2-253620 | * | 10/1990 | |
| JP | 5-3184 | * | 1/1993 | |
| JP | 5-3184 | * | 5/1993 | |
| JP | 5-32471 | * | 12/1993 | |
| JP | 6-196465 | * | 7/1994 | |
| JP | 7-14811 | * | 1/1995 | |
| JP | 7-283185 | * | 10/1995 | |
| JP | 7-335599 | * | 12/1995 | |
| JP | 8-254695 | | 10/1996 | ........ G02F/1/1335 |
| JP | 9-162150 | | 6/1997 | ........ H01L/21/304 |
| JP | 9-293658 | * | 11/1997 | |
| JP | 10-242110 | * | 9/1998 | |
| JP | 11-24282 | * | 1/1999 | |
| JP | 11-238713 | | 8/1999 | ........ H01L/21/304 |
| JP | 11-354480 | | 12/1999 | ........ H01L/21/304 |
| JP | 2000-188272 | | 7/2000 | ........ H01L/21/304 |
| JP | 2001-53047 | | 2/2001 | ........ H01L/21/304 |
| JP | 2002-164317 | * | 7/2002 | |
| WO | WO 99/13498 | | 3/1999 | ........ H01L/21/00 |
| WO | WO 00/46841 | * | 8/2000 | |

OTHER PUBLICATIONS

Keizo, "Patent Abstracts of Japan", Publ. 11238713, EPO, Aug. 31, 1999, ©1999, JPO, Tokyo, Japan.
Naoki, "Patent Abstracts of Japan", Publ. 02012819, EPO, Jan. 17, 1990, ©1990, JPO & Japio, Japan.
Satoshi, "Patent Abstracts of Japan", Publ. 2000188272, EPO, Jul. 4, 2000, ©2000, JPO, Japan.

* cited by examiner

*Primary Examiner*—Frankie L. Stinson
(74) *Attorney, Agent, or Firm*—Martine & Penilla, LLP

(57) ABSTRACT

A wafer preparation module is provided. The wafer preparation module includes an enclosure, which contains wafer engaging rollers. The wafer engaging rollers are oriented at an angle and are designed to spin a wafer at an angle during preparation.

14 Claims, 11 Drawing Sheets

ANGULAR SPIN, RINSE, AND DRY MODULE AND METHODS FOR MAKING AND IMPLEMENTING THE SAME

BACKGROUND OF THE INVENTION

1. Field of the Invention

The present invention relates generally to semiconductor wafer preparation and, more particularly, to the cleaning and drying of a semiconductor substrate using space- and process efficient spin, rinse, and dry (SRD) modules.

2. Description of the Related Art

Wafer preparation and cleaning operations are performed in the fabrication of semiconductor devices. One common wafer preparation operation dispersely repeated during substrate preparation is a spin rinse and dry operation using a spin, rinse, and dry (SRD) module. Typically, the spin, rinse, and dry operations are performed in a bowl mounted on an SRD housing, which in turn is secured to a spindle. Typically, a motor causes the spindle, a chuck mounted on the spindle, and the wafer held by spindle fingers attached to the chuck to rotate. Generally, to receive the wafer to be prepared, the spindle fingers move upwardly within the bowl such that they extend outside the bowl and above the wafer processing plane. At this point, an end effector delivers the wafer to be processed to the spindle fingers. Subsequent to receiving the wafer, the spindle fingers and the wafer attached thereto move back down and into the bowl, thus placing the wafer at the level of wafer processing plane.

Generally, the wafer is rinsed by applying de-ionized (DI) water onto the surface of the wafer through a spigot, as the wafer is spun at high revolutions per minute (RPMs). Once the rinsing operation has concluded, the supplying of DI water is stopped by turning off the spigot, and then wafer is dried as the wafer is continuously spun at high RPMs. As soon as the drying operation has completed, for a second time, the chuck, the spindle fingers, and the wafer are moved out of the bowl and above the wafer process plane. At this time, an end effector reaches in and removes the wafer from the SRD module.

Several limitations are associated with the conventional SRD modules. Primarily, in the typical SRD modules, the wafers are processed in the horizontal orientation. Consequently, to achieve a wafer surface free of contaminants, the wafer must be spun for a significant period of time at high RPMs, thus increasing the spin, rinse, and dry cycle per wafer. As can be appreciated, this reduces the overall throughput of the SRD module.

A second limitation is the disposing of the heavy and large chuck assembly as well as the large motor required to drive the chuck assembly inside the SRD module. A third limitation is the use of an enormous frame support to accommodate the multiplicity of forces created by the spinning of the wafer at high RPMs for an extended period. As a combined effect of these two limitations, the conventional SRD modules have significantly large frames and frame supports, thus unnecessarily occupying a significantly large valuable clean room space.

Additionally, besides unnecessarily occupying valuable space, the chuck assemblies have extremely complex designs. For instance, the chuck assemblies are designed to rotate and move up and down within the bowl so as to receive or deliver the wafer. As a result, the movement of the chuck assembly within the bowl mandates that the chuck remain properly calibrated so that it comes to rest at the exact process level. In the situations the chuck is not aligned properly, the chuck assembly must be realigned. This process is very time consuming and labor intensive, and it requires that the SRD module be taken off-line for an extended period of time, thus reducing throughput.

In addition to needing realigned constantly, the chuck assemblies perform unnecessary movements to load and unload the wafers to and from the spindle fingers. By way of example, in conventional SRD modules, the loading of the wafer onto the spindle fingers involves four stages. First, to receive a wafer, the chuck and the spindles are moved out of the bowl, such that the spindles are positioned above the wafer process plane. As a result, to deliver the unprocessed wafer to the edges of the spindle fingers, the end effector holding the wafer is first moved horizontally over the bowl at a level that is above the horizontal plane of the spindle fingers (which are already in the up position). Thereafter, the end effector must move downwardly (while over the bowl) until the wafer reaches the level of the spindle finger at which point the spindle fingers can engage the wafer. Once the spindle fingers have engaged the wafer, the end effector relinquishes the wafer and thus physically delivering the unprocessed wafer to the spindle fingers. Finally, to pull out, the end effector is required to move slightly down and away from the wafer before moving horizontally away from over the bowl. Each of the up and down movements of the end effector is performed using the "Z" speed of the end effector, which in fact is a significantly low speed. As a result, in each spin, rinse, and dry cycle, a significant amount of time is spent merely to load and unload the wafer. Hence increasing the SRD cycle per wafer, which in turn reduces the overall throughput of the SRD module.

In view of the foregoing, a need therefore exists in the art for a spin, rinse, and dry module that occupies less clean room space and produces higher throughput while efficiently improves the spin, rinse, and dry operations performed on the surfaces of the substrates.

SUMMARY OF THE INVENTION

Broadly speaking, the present invention fills these needs by a spin, rinse, and dry (SRD) module and methods for implementing the same that efficiently optimize the spin, rinse, and dry operations performed on the surfaces of the substrates. The SRD module of the present invention occupies less clean room space while producing higher throughput. Preferably, the SRD module of the present invention implements a pair of drive rollers and an engaging roller to engage the substrate during the spin, rinse and dry operations. The pair of drive rollers and the engaging roller are disposed within the SRD module such that while the rollers engage the substrate during the spin, rinse, and dry operations, a plane containing the substrate, herein defined as a process plane, creates a process angle with the horizontal plane. In preferred examples, the drive rollers are configured to spin the engaged substrate while the engaging roller is configured to be retractable so as to create a clear path for the loading and unloading of the substrate.

It should be appreciated that the present invention can be implemented in numerous ways, including as a process, an apparatus, a system, a device, or a method. Several inventive embodiments of the present invention are described below.

In one embodiment, a method for processing a substrate in a spin, rinse, and dry (SRD) module is disclosed. The method includes providing the substrate to be processed, positioning the SRD module in a substrate receive position, and orienting the substrate to be processed at an insert position that is defined at an angle. The method further includes inserting the substrate into the SRD module at the angle, and placing the SRD module in a process position. Also included is spinning the substrate at the angle, and rinsing and drying the substrate being spun at the angle.

In another embodiment, a method for processing a wafer in a spin, rinse, and dry (SRD) module is disclosed. The method includes engaging a wafer in a process plane, and spinning the wafer in the process plane. The process plane is configured to define a process angle with a horizontal plane configured to optimize the performance of the SRD module. The method further includes cleaning a top surface and a bottom surface of the wafer while spinning the wafer in the process plane.

In yet another embodiment, a method for processing a wafer in a spin, rinse, and dry (SRD) module is disclosed. The method includes engaging a wafer in a process plane, spinning the wafer in the process plane, and cleaning a top surface and a bottom surface of the wafer while spinning the wafer in the process plane. The process plane is configured to define a process angle with a horizontal plane designed to optimize the performance of the SRD module. The cleaning a top surface and the bottom surface of the wafer is designed to include rinsing the top surface and the bottom surface of the wafer with DI water while spinning the wafer in the process plane. The cleaning a top surface and the bottom surface of the wafer further includes applying a megasonic flow to the top surface and the bottom surface of the wafer while spinning the wafer in the process plane.

In still a further embodiment, a method for processing a wafer in a spin, rinse, and dry (SRD) module is provided. The method includes engaging and spinning a wafer in a process plane. The process plane is configured to define a process angle with the horizontal plane designed to optimize a drying of the wafer. The method further includes cleaning and drying a top surface and a bottom surface of the wafer while spinning the wafer in the process plane.

In still a further embodiment, a wafer preparation module is disclosed. The wafer preparation module includes an enclosure, which contains wafer engaging rollers. The wafer engaging rollers are oriented at an angle and are designed to spin a wafer at an angle during preparation.

In still another embodiment, a spin, rinse, and dry (SRD) module is disclosed. The SRD module includes an enclosure, a pair of driver rollers, and an engaging roller. The enclosure has an outer wall that includes a window therein. The window is defined within the outer wall so as to create a process angle with a horizontal plane. The pair of drive rollers is defined within the enclosure and are configured to spin a substrate to be processed while engaging the substrate to be processed. The engaging roller is defined within the enclosure and is configured to engage the substrate to be processed. The engaging roller and the pair of drive rollers are configured to engage the substrate to be processed such that the substrate to be processed creates an angle with the horizontal plane that is substantially equivalent to the process angle.

The advantages of the present invention are numerous. Most notably, unlike conventional SRD modules, the angular SRD module of the present invention implements rollers to engage and spin the substrate to be processed at a process/insert angle configured to optimize the drying of the surfaces of the substrate. In this manner, the number of movements required to load and unload the wafers are decreased, reducing the time for each spin, rinse, and dry cycle, thus increasing throughput. Another benefit is the implementation of rollers rather than the spindle fingers and chuck. That is, by implementing rollers to engage the wafer, the angular SRD module of the present invention ensures the cleaning of the whole wafer, i.e., both, top and bottom surfaces of the wafer. Yet another benefit is that due to the wafer being engaged at an angle, less mechanical movements are necessary to process the wafer, thus the wafer can be processed using non-destructive low to high RPMs.

Still another benefit of the present invention is that by using rollers rather than the chucks and spindle fingers, the angular SRD module 100 of the present invention is smaller than the current SRD modules, thus occupying less clean room space. Still a further benefit of the present invention is employing improved drying methods. That is, as a result of using the combined effects of the dry assist mechanism, the processing of the wafer at an angle, and using highly evaporative solvents to clean the wafer, the drying operation of the present invention is significantly enhanced. For example, the present invention efficiently dries a wafer while it ensures edge cleanliness. As a result, the drying cycle of the SRD module is reduced, thus increasing the throughput. Ultimately, the angular SRD module achieves a drier wafer implementing low non-destructive RPMs.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF EXEMPLARY EMBODIMENTS

Embodiments of a spin, rinse and dry (SRD) module to optimize processing of substrate surfaces are described. Preferably, the SRD module implements a pair of drive rollers and an engaging roller to engage the substrate at an angled process plane, thus optimizing the operations of the SRD module. In preferred embodiments, the drive rollers are configured to spin so as to drive the substrate being processed. In one preferred example, while the drive rollers remain in place as they spin the substrate during the spin, rinse, and dry operations, the engaging roller is configured to be retractable so as to be moved in and out of its place, thus providing clearance for unloading and loading of the substrate, respectively.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
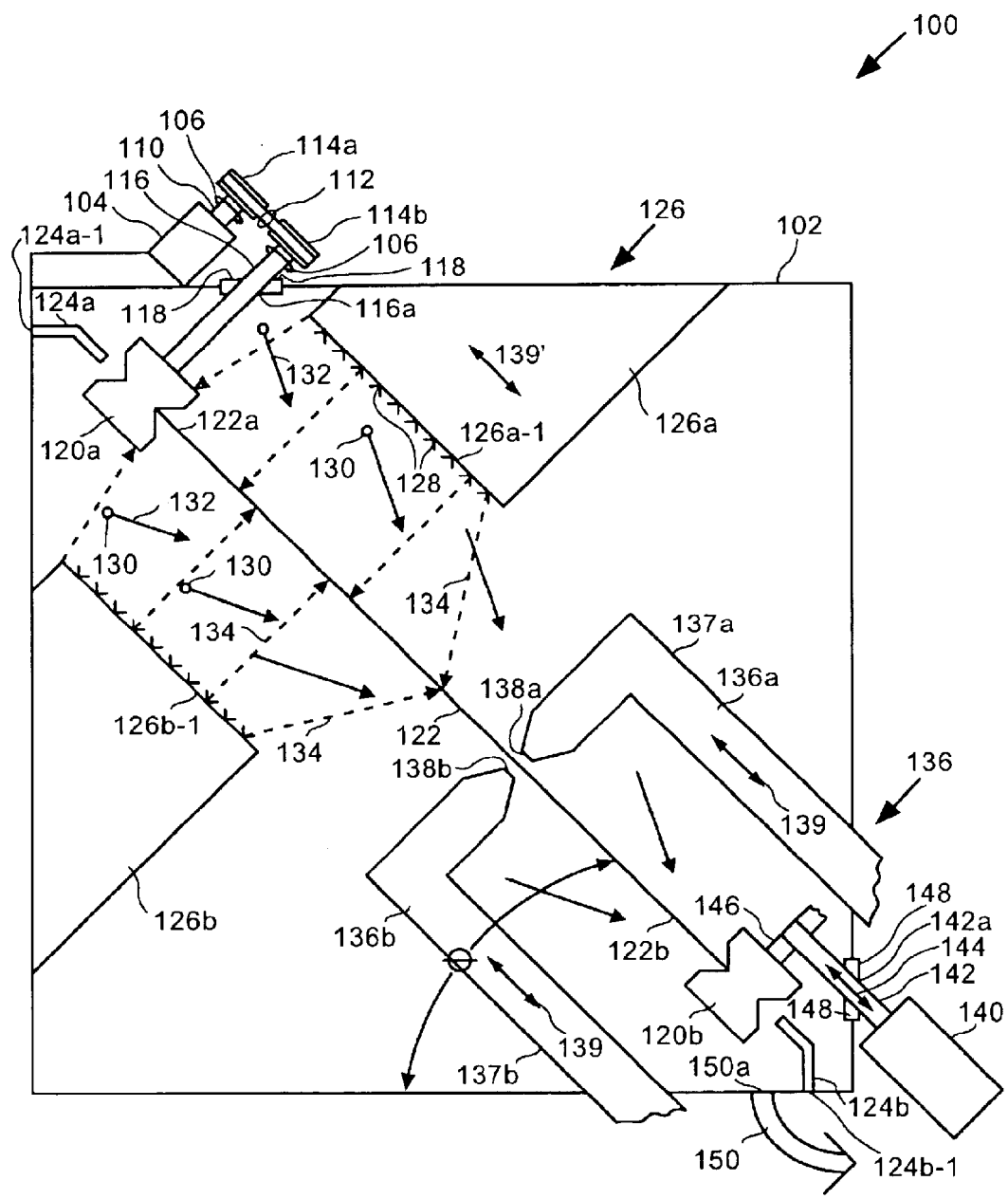
FIG. 1 is a simplified cross-sectional view of an exemplary angular spin, rinse, and dry (SRD) module, in accordance with one embodiment of the present invention.

FIG. 1 is a simplified cross-sectional view of an exemplary angular SRD module, in accordance with one embodiment of the present invention. The angular SRD module includes an enclosure 102 designed to be self-contained for the reasons to be described in greater detail below. As shown, the angular SRD module further includes a first drive roller 120a, a second drive roller 120a' (not shown in this Figure), and an engaging roller 120b, all configured to engage a wafer 122 during the spin, rinse and dry operations. As illustrated, the first drive roller 120a, the engaging roller 120b, and the wafer 122 are disposed within the enclosure 102 such that the extension of a plane containing the engaged wafer 122 creates a process angle θ with a horizontal plane. In this manner, orienting the wafer 122 at a process angle θ is configured to optimize the drying of the wafer 122 by directing the cleaning fluid downwardly and away from the wafer 122 being processed. In preferred embodiments, the angle θ ranges from approximately about zero (0) degree to approximately about ninety (90) degrees.

As shown, the first drive roller 120a is coupled to a roller drive shaft 116 that is inserted through an opening 116a of the enclosure 102. The first drive roller 120a is configured to spin as the roller drive shaft 116 rotates in a rotation direction 106. In this implementation, the roller drive shaft 116 and thus the first drive roller 120a are driven by a drive motor 104 disposed outside the enclosure 102 for the reasons that will be described in detail below. As shown, a motor drive shaft 110 coupled to the drive motor 104 rotates in a rotation direction 106, thus causing a drive belt 112 mounted on drive pulleys 114a and 114b to rotate. The rotation of the drive pulley 114b in turn causes the roller drive shaft 116, drive roller 120a, and the wafer 122 to spin.

It must be noted that the second drive roller 120a' is defined at a 120-degree angle of the first drive roller 120a, as the first drive roller 120a and the second driver roller 120b engage the wafer 122 in the process plane. Again, similar to the first driver roller 120a, the second drive roller 120a' is designed to be driven by a drive motor similar to that of the first drive roller 120a. However, in one embodiment, the first and second drive rollers 120a and 120b may be driven by one drive motor. Additionally, the first drive roller 120a and the second drive roller 120a' are configured to remain in their places while spinning. Additional details regarding the orientation of the first drive roller 120a, second drive roller 120a', and the engaging roller 120b within the angular SRD module 100 are set forth below in connection with the description of FIGS. 2A–2C.

While the first drive roller 120a and the second drive roller 120a' are designed to spin the wafer 122, the engaging roller 122b is merely designed to engage the wafer 122 while the wafer 122 is being processed. Additionally, in contrast to the first drive roller 120a and the second drive roller 120a' that are designed to remain in place, the engaging roller 120b is designed to be retractable. That is, the engaging roller 120b is designed such that it can be moved in and out of its place so as to provide enough clearance for the loading and unloading of the wafer 122. In one embodiment, the engaging roller 120b is moved out of its place using an air cylinder 140 disposed outside of the enclosure 102 for the reasons that will discussed in greater detail below. As shown, the engaging roller 120b is coupled to an arm 146 attached to a piston 142 of the air-cylinder 140. The piston 142 is inserted into the enclosure 102 through an opening 142a. As the piston 142 is moved in the movement direction 144, the piston 142 causes the engaging roller 120a to be moved in and out of position. By way of example, the excursion of the piston 142 is designed to pull on the engaging roller 120b such that the engaging roller 120b is moved out of position sufficiently to provide adequate clearance for an end effector to load and unload a wafer 122. Subsequently to the loading and unloading of the wafer, the stroke of the piston 142 is configured to push the engaging roller 120b back to its initial position.

With a continued reference to FIG. 1, as illustrated, the angular SRD module 100 further includes a cleaner dispenser 126 having a top dispenser 126a and a bottom dispenser 126b. Each of the top and bottom dispensers 126a and 126b has a respective surface 126a-1 and 126b-1 each of which includes a plurality of orifices 128. The plurality of orifices 128 are configured to deliver cleaning fluid onto a top and bottom surfaces 122a and 122b of the wafer 122. As shown, in this embodiment, the surface 126a-1 of the top dispenser 126a is defined within the enclosure 102 such that the surface 126a-1 faces the top surface 122a of the wafer 122. Furthermore, as illustrated, the surface 126b-1 of the bottom dispenser 126b is defined within the enclosure 102 such that the surface 126b-1 faces the bottom surface 122b of the wafer. However, one must appreciate that in another implementation, the cleaner dispenser 126 may be defined within the enclosure 102 in a different orientation so long as the cleaner dispenser 126 can provide a substantially even coat of cleaning liquid onto a sector of the wafer 122.

Preferably, fluid jet streams 134 are delivered onto the top and bottom surfaces 122a and 122b of the wafer 122 through the plurality of orifices 128 such that, at any given time, at least a sector of the wafer 122 is being cleaned. In this manner, it is ensured that the cleaning dispenser 126 100 almost evenly applies a coat of cleaning liquid that covers substantially a portion of the wafer 122 extending from the center of the wafer to the edge of the wafer. In one embodiment, fluid jet streams 134 are applied almost evenly onto top and bottom surfaces 122a and 122b of the wafer 122 being processed such that the cleaning fluid covers almost one-half of the top and bottom surfaces 122a and 122b of the wafer 122.

Preferably, the dispenser cleaner 126 is designed to dislodge, loosen, and remove particulate contaminants, residues, and chemicals from the top and bottom surfaces 122a and 122b. By way of example, particulate contaminants may be particulates and metals, with particulates being tiny bits of material present on the top or bottom surfaces 122a and 122b of the wafer 122 (e.g., dust, silica ($SiO_2$), slurry residue, polymeric residue, metal flakes, atmospheric dust, plastic particles, silicate particles, etc.).

Preferably, to dislodge, loosen, or remove the contaminants, the dispenser cleaner 126 is designed to implement a highly evaporative cleaning fluid configured not to leave any residue on the top and bottom surfaces 122a and 122b. However, it must be appreciated that in another example, the dispenser cleaner 126 of the present invention may implement any suitable fluid media to clean the surfaces of the wafer 122 so long as the fluid media evaporates rapidly and leaves no residue (e.g., deionized water, hydrofluoric acid (HF), ammonium hydroxide ($NH_4OH$), ammonia, ethylene diamine tetra acetic acid (EDTA), tera methyl ammonium hydroxide (TMAH), citric acid, hydrochloric acid, hydrogen peroxide, MCC3000, MCC2500, isopropyl alchohol (IPA) mixtures thereof, and any cleaning agent, any solvent, etc.). Furthermore, in accordance to one embodiment of the present invention, the cleaner dispenser 126 is designed to move back and forth along the angled process plane over the top and bottom surfaces 122a and 122b in a movement direction 139' (i.e., back and forth over the radius r of the wafer 122).

Furthermore, in one example, the cleaning operations performed on the wafer 122 within the angular SRD module may further include scrubbing the top and bottom surfaces 122a and 122b of the wafer 122 in the process plane (i.e., at an angle). For instance, in one embodiment, the angular SRD module may define a top brush roller and a bottom brush roller within the enclosure 102. As oriented, each of the top brush roller and the bottom brush roller is configured to clean the top surface 122a and the bottom surface 122b of the wafer 122, respectively.

As illustrated, in one implementation, the cleaning operations performed on the wafer 122 in the angular SRD module are enhanced by applying megasonic through implementing a megasonic spray assembly 136. As shown, the megasonic spray assembly 136 includes a top megasonic spray 136a and a bottom megasonic spray 136b, each of which is configured to respectively clean the top surface 122a and the bottom surface 122b of the wafer 122. As shown, the top megasonic spray 136a includes a top megasonic arm 137a attached to a top megasonic spray nozzle 138a. The top megasonic spray nozzle 138a is configured to spray a liquid agitated with a sonic wave at a megasonic frequency onto the top surface 122a of the wafer 122. In a like manner, a bottom megasonic spray nozzle 138b affixed to a megasonic arm 137b of the bottom megasonic spray 136a applies a conical spray of a liquid agitated with a sonic wave at a megasonic frequency onto the bottom surface 122b of the wafer 122. Liquid is delivered to each of the top and bottom megasonic spray nozzles 138a and 138b through a corresponding tube or other hollow passage in each of the respective top and bottom megasonic arm 137a and 137b.

In this embodiment, each of the top and bottom megasonic spray nozzles 138a and 138 is configured to rotate. In a different example, in addition to rotating, each of the top and bottom megasonic spray nozzles 138a and 138b is designed to move back and forth along the angled process plane over the top and bottom surfaces 122a and 122b in a megasonic movement direction 139. That is, the top and bottom megasonic spray nozzles 138a and 138 are configured to move from the center of the wafer 122 to the edge of the wafer 122 and then back to the center of the wafer 122 (i.e., back and forth over the radius r of the wafer 122). Hence, the megasonic spray assembly 136 of enhances the cleaning of the cleaner dispenser 126 by loosening, softening, dislodging, and removing the finer particulate contaminants, residues, and chemicals remaining on the top and bottom surfaces 122a and 122b subsequent to the cleaning of the wafer 122.

It must be appreciated by one of ordinary skill in the art that in a different embodiment, the megasonic spray assembly 136 may have different components so long as the megasonic assembly 136 can spray a liquid agitated with a sonic wave at a megasonic frequency onto top and bottom surfaces of a wafer 122. Furthermore, the megasonic spray assembly 136 may spray any suitable liquid onto the top and bottom surfaces 122a and 122b of the wafer 122 (e.g., DI water). Additionally, the duration and intensity of the megasonic conical spray varies depending on pre-established process-data-requirements.

For additional information on megasonic cleaning, reference can be made to: U.S. patent application Ser. No. 09/343,208, filed on Jun. 29, 1999, having inventors Jeff Farber, Allan Radman, Julia Svirchevski, and Helmuth Treichel, and entitled "HIGH RPM MEGASONIC CLEANING." This U.S. Patent Application, which is assigned to Lam Research Corporation, the assignee of the subject application, is incorporated herein by reference.

Continuing with the embodiment of FIG. 1, the drying operations of the angular SRD module 100 is enhanced through a dry assist process implementing two separate components of gas dispensing mechanism and distributed gas flow mechanism. In the gas dispensing mechanism, the angular SRD module includes a plurality of nozzles 124a, 124a' (not shown in this Figure), and 124b inserted into the enclosure 102 through respective openings 124a-1, 124a-1', and 125b-1. As shown, each of the nozzles 124a, 124a', and 124b is disposed within the enclosure 102 such that gas dispensed through each of the nozzles 124a, 124a', and 124b is applied onto the first drive roller 120a and the second drive roller 120a' and engaging roller 120b, respectively. In this manner, the gas dispensed through the nozzles 124a, 124a', and 124b causes any liquid remaining on the respective first or second drive roller 120a and 120a' and the engaging roller 120b to be blown off, thus drying the rollers and the edge of the wafer 122 being processed. Furthermore, the dispensing of gas through the nozzles 124a, 124a', and 124b further enhances the cleaning of the top and bottom surfaces 122a and 122b of the wafer 122 by blowing off the liquid away from the top and bottom surfaces 122a. As a result, the gas dispensing mechanism achieves dry rollers while it enhances the drying of the edge of the wafer as well as wafer surfaces.

By way of example, in this embodiment, the gas blow off nozzles 124a, 124a', and 124b are configured to dispense heated nitrogen onto the first and second drive rollers 120a and 120a' and the engaging roller 120b. However, in a different example, any appropriate gas can be used to expedite the drying of the drive rollers 120a and 120a' and the engaging roller 120b, the edge of the of the wafer 122, and the top and bottom surfaces 122a and 122b (e.g., $CO_2$, clean dry air (CDA), Nitrogen, etc.).

The drying of the wafer is further improved by employing a distributed gas flow mechanism. As shown, a plurality of gas feed-holes 130 are defined on an inner wall 102a of the enclosure 102 so as to allow gas flow within the enclosure 102. The gas feed-holes 130 are configured to have directionality in a gas flow direction 132 aimed at the top and bottom surfaces 122a and 122b of the wafer 122. In this manner, gas is evenly distributed through the enclosure 102 so as to expedite substantially uniform drying of both top and bottom surfaces 122a and 122b.

Preferably, the gas distributed through out the enclosure 102 is filtered utilizing an Ultra Low Particulate Arresting (ULPA) filter. Additionally, in preferred embodiments, the gas implemented is either air or nitrogen. However, in another example, any appropriate gas may be utilized to expedite even drying of the top and bottom surfaces 122a and 122b of the wafer. In accordance with one example, ducted airflow is directed at the top and bottom surfaces 122a and 122b of the wafer 122, which as will be explained in detail below, will then be exhausted.

With a continued reference to the embodiment of FIG. 1, the enclosure 102 of the angular SRD module 100 further includes an exhaust 150a coupled to an exhaust pipe 150 disposed outside of the enclosure 102. The exhaust 150a is configured to receive the gas flow and liquid flow within the enclosure 102 and remove same to outside of the enclosure 102 utilizing the exhaust pipe 150a. In this manner, the environment within the enclosure 102 is maintained clean during the spin, rinse, and dry operations of the module.

In addition to implementing the exhaust 150, the angular SRD module 100 of the present invention disposes the drive motors 104 and 104' as well as the air cylinder 140 outside of the SRD enclosure 102, thus eliminating further introduction of particulate contaminants into the enclosure 102. Furthermore, each of the roller drive shaft 116 and 116' and the piston 142 is configured to be fitted within a pair of seals 118 and 148, respectively. The seals 118 and 148 are disposed in close proximity to the openings 116a-1, 116a-2, and 142a-1 of the enclosure 102. In this manner, advantageously, the seals 118 and 148 engage each of the roller drive shaft 116 and piston 142 secure in their position, thus preventing the introduction of excess particulate contaminants into the enclosure 102.

Furthermore, the angular SRD module 100 implements a dual-barrier enclosure. That is, in addition to the enclosure 102, the module also implements an outer enclosure 102' (not shown in this Figure) configured to envelope the enclosure 102. In this manner, the outer enclosure 102' is configured to contain any liquid or gas leakage from the enclosure 102. In the event a leakage occurs, a drain defined between the outer enclosure 102' and the enclosure 102 is configured to dispose of the waste entrapped between the two enclosures 102 and 102'.

As a result, the angular SRD module 100 of the present invention cleans and dries the top and bottom surfaces 122a and 122b as well as the edge of the wafer 122 thoroughly, expeditiously, and efficiently. Furthermore, as the angular SRD module 100 employs drive rollers, rather than chucks and spindle fingers, to spin the wafer, the enclosure 102 is significantly smaller than the current SRD modules, thus occupying less clean room space. Additionally, the drying operation of the angular SRD module 100 is further enhanced due to the combined effects of the dry assist mechanisms, the processing of the wafer at an angle, and using the highly evaporative solvents to clean the wafer. For instance, preferably, the angular SRD module 100 may implement a speed of approximately about 1000 RPMs to produce a dry wafer. Consequently, the angular SRD module 100 produces a drier wafer implementing a lower RPM, thus eliminating the need to implement a huge frame to support the SRD module 100 of the present invention. Accordingly, the SRD module 100 of the present invention occupies less space while it employs less destructive speed to efficiently achieve a drier and cleaner processed wafer.

Figure 2A:
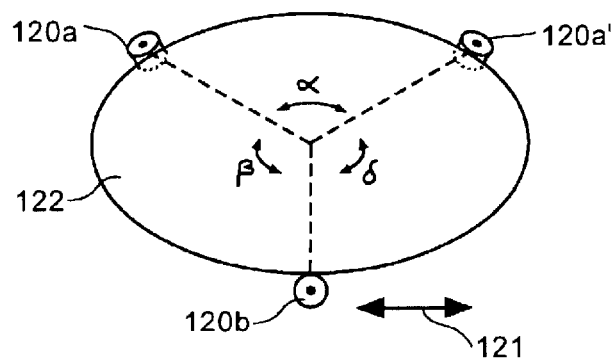
FIG. 2A is a perspective view of the first and second drive rollers and the engaging roller engaging the wafer, in accordance with one embodiment of the present invention.

Reference is now made to FIG. 2A showing a perspective view of the first and second drive rollers 120a and 120a' and the engaging roller 120b holding the wafer, in accordance with one embodiment of the present invention. As shown, each of the first and second drive rollers 120a and 120b and the engaging roller 120b are defined around the edge of the wafer 122 such that each is placed within a 120-degree angle of the other two rollers. That is, each of the angles a formed between the first drive roller 120a and the second driver roller 120a', β formed between the first drive roller 120a and the engaging roller 120b, and δ formed between the engaging roller 120b and the second driver roller 120a' are configured to be equivalent to 120 degrees. Furthermore, as shown, the engaging roller 120b is designed to move back and forth in a movement direction 121.

It must be noted by one of ordinary skill in the art that the first and second drive rollers 120a and 120b and the engaging roller 120b may be defined around the wafer 122 such that the angles α, β, and δ are not equivalent. Furthermore, it must be noted that in a different embodiment, one or more than two drive rollers may be implemented to spin the wafer during the spin, rinse, and dry operations.

Figure 2B:
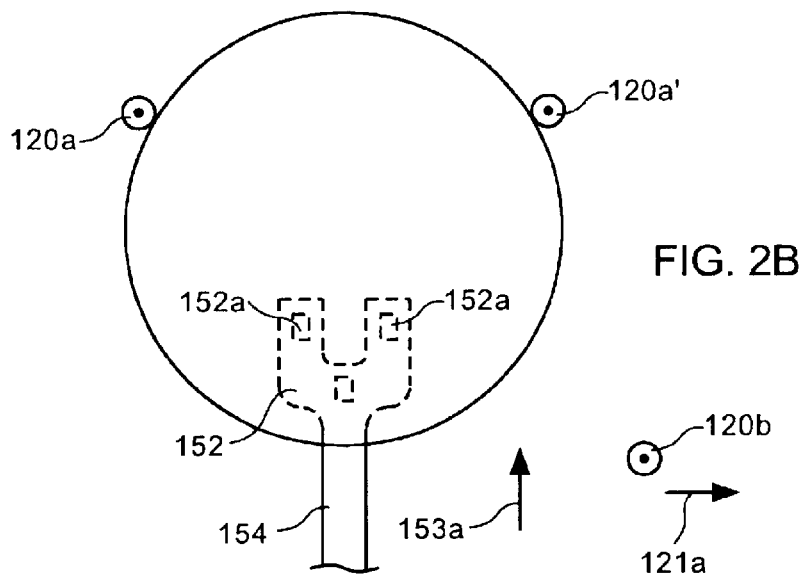
FIG. 2B is a top-view showing the engaging roller moving out of position during the loading of the wafer by an end effector, in accordance with another embodiment of the present invention.
Figure 2C:
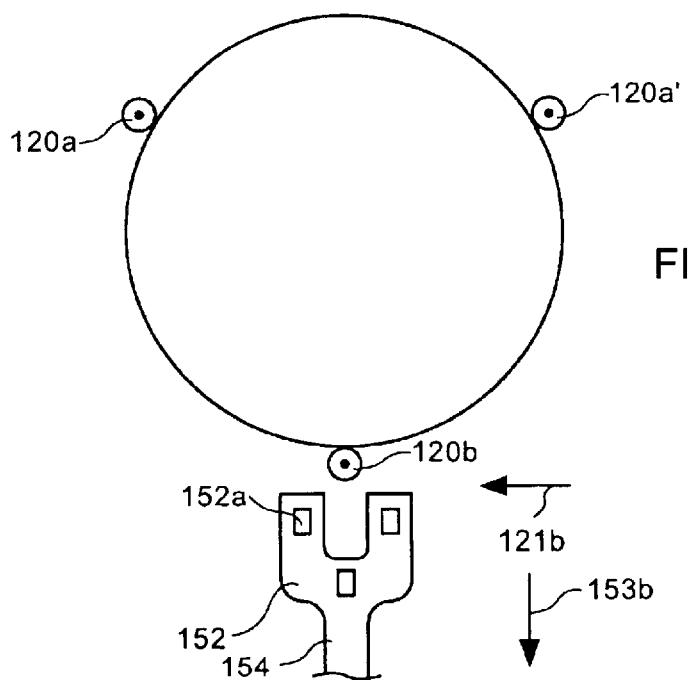
FIG. 2C is a top-view showing the engaging roller moving back to its initial position subsequent to the loading of the wafer by an end effector, in accordance with yet another embodiment of the present invention.

The movements of the engaging roller 120b during the loading of the wafer 122 by an end effector can further be understood with respect to FIGS. 2B and 2C, in accordance to one embodiment of the present invention. As shown in FIG. 2B, as a blade 154 attached to an end effector 152 having a plurality of suctions 152a' thereon approaches in the movement direction 153a to load the wafer 122, the engaging wafer 120b is pulled away in a movement direction 121a. In this manner, the end effector 152 has enough clearance to deliver the wafer 122 to the first and second drive rollers 120a and 120a'. Thereafter, as illustrated in FIG. 2C, subsequent to the loading of the wafer into the SRD module, after the end effector arm 152 retreats in the movement direction 153b and out of the way of the engaging roller 120b, the engaging roller 120b is released so as to assume its original position. Hence, as will described in detail below with respect to FIGS. 4A–4D and 5, the number of movements required to load and unload the wafer to the angular SRD module 100 of the present invention is reduced.

Figure 3A:
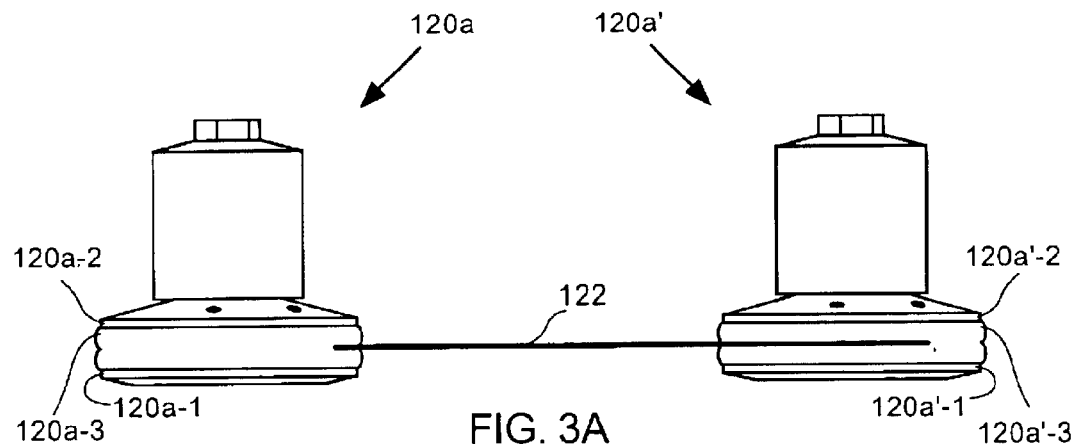
FIG. 3A is a simplified side-view of the first drive roller and second drive roller securing the wafer, in accordance with one embodiment of the present invention.
Figure 3B:
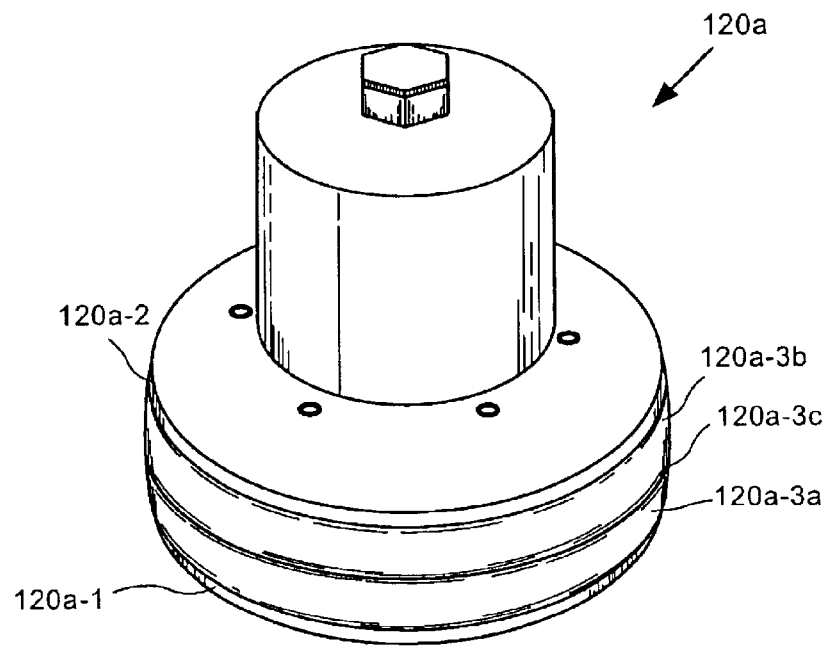
FIG. 3B is an exploded view of a drive roller, in accordance with yet another embodiment of the present invention.

The engaging of the wafer 122 by the first and second drive rollers and engaging roller as well as the structure of the drive and engaging rollers can further be understood with reference to FIGS. 3A–3B. FIGS. 3A depicts a simplified side-view of the first drive roller 120a and second drive roller 120a' securing the wafer 122, in accordance with one embodiment of the present invention. As shown, the first drive roller 120a has a lower wheel 120a-1, an upper wheel 120a-2, and a pair of grip rings 120a-3 for engaging the wafer 122 to be processed. In a like manner, the second drive roller 120a' is configured to include a lower wheel 120a'-1, an upper wheel 120a'-2, and a pair of grip rings 120'a-3 for engaging the wafer 122.

As further shown in the exploded view of the first drive roller 120a of FIG. 3B, the pair of grip rings 120a-3 has a lower grip ring 120a-3a, an upper grip ring 120a-3b, and a V-shaped groove 120a-3c. The V-shaped groove 120a-3c is configured to engage and secure the wafer 122, while the wafer is spun during the spin, rinse, and dry operations. Preferably, in one implementation, the first and second drive rollers 120a and 120a' and the engaging roller 120b implement a polyurethane pad in the V-shaped grooves to secure and engage the wafer. However, in another example, the first and second drive rollers 120a and 120b and the engaging roller 120b are machined polyurethane rollers having V-shaped grooves.

For additional information on the structure of the drive and engaging rollers, reference can be made to: U.S. patent application Ser. No. 09/687,747, filed on Oct. 13, 2000, having inventors Douglas G. Gardner, Stephen Mark Smith, and Brian M. Bliven, entitled "EDGE ROLLER ASSEMBLY, METHOD FOR CONTACTING AN EDGE OF A SUBSTRATE, AND TRANSPORT SYSTEM FOR TRANSPORTING SEMICONDUCTOR WAFERS TO A WAFER PROCESSING STATION." This U.S. Patent Application, which is assigned to Lam Research Corporation, the assignee of the subject application, is incorporated herein by reference.

The loading and unloading of wafers to and from the SRD module 100 and their transfer from an input cassette 168 of the load station 164 to an output cassette 158 can further be understood with respect to FIGS. 4A–4D. As illustrated in the side-view of the embodiment in FIG. 4A, the robot 156 implements the end effector 152 to extract a wafer 122 from the input cassette 168 while the end effector 152 and the blade 156 are in a horizontal orientation.

Figure 4A:
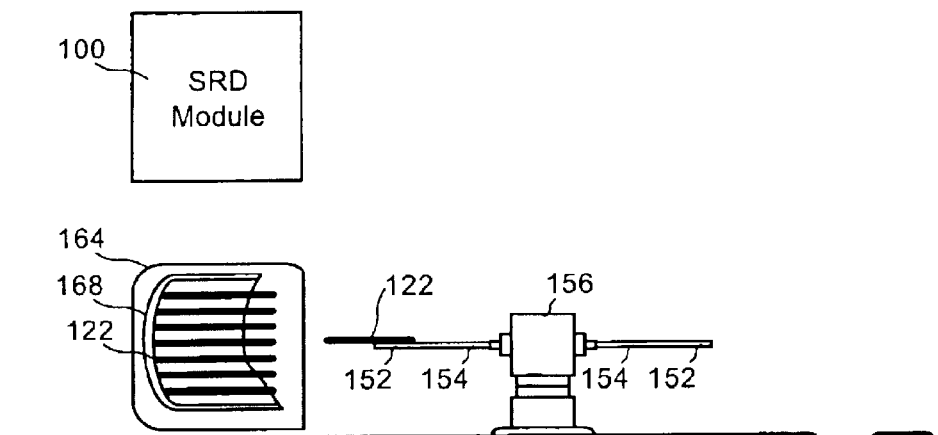
FIG. 4A is a simplified side-view depicting the extracting of a wafer from an input cassette by an end effector, in accordance with still another embodiment of the present invention.
Figure 4B:
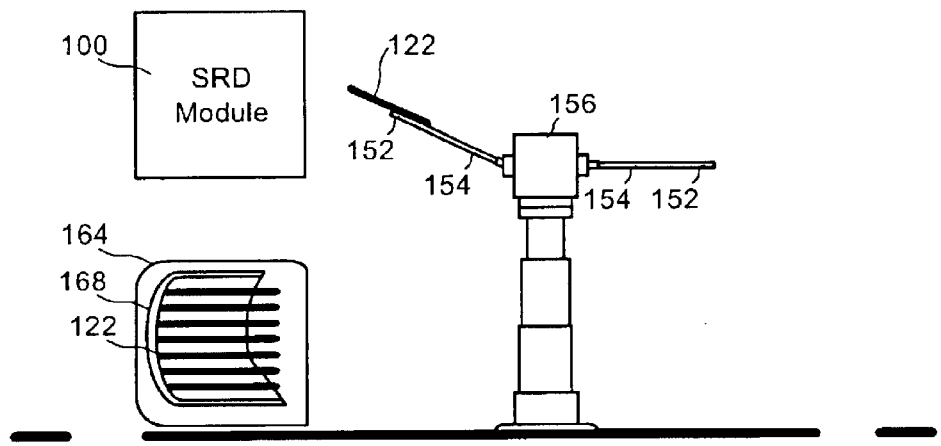
FIG. 4B is a simplified side-view illustrating an end effector realigning a wafer to parallel the angular orientation of the process plane, in accordance with one embodiment of the present invention.

Subsequently, as illustrated in FIG. 4B, the robot 156 is extended to the level of the SRD module 100. As illustrated, the blade 154 has shifted the end effector 152 and thus the wafer 122 such that the wafer 122 is aligned with the angular orientation of the process plane. In this manner, unnecessary steps in loading the wafer are eliminated, thus increasing the efficiency of the angular SRD module.

Figure 4C:
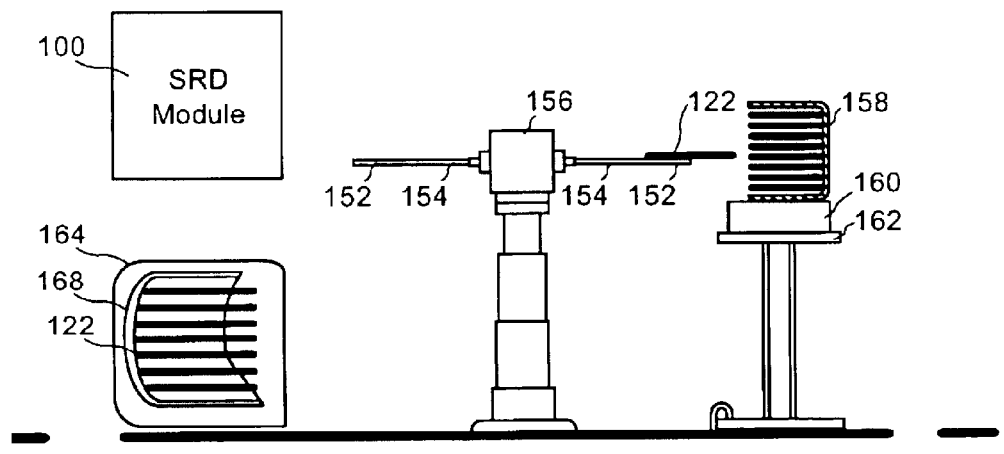
FIG. 4C is a simplified side-view illustrating the realigning of a processed wafer subsequent to its extraction from the angular SRD module and its transfer into an output cassette, in accordance with one embodiment of the present invention.

As shown in FIG. 4C, once the SRD module 100 has concluded the processing of the wafer 122, and the end effector 152 extracts the wafer 122 from the SRD module while the wafer 122 is still in an angular orientation. Again, the unnecessary steps in unloading of the wafer 122 are eliminated. Thereafter, the blade 156 shifts so as to align the end effector 152 and the wafer 122 in the horizontal orientation so as to transport the clean wafer 122 to an output station. As illustrated in FIG. 4C, in one implementation, the end effector 152 unloads the wafer 122 to an output cassette 158 positioned on a base 160 defined on an output shelf 162. As shown, the output cassette 158 is configured to hold a number of cleaned wafers 122. In another embodiment, as explained below with respect to FIG. 5, a standard mechanical interface (SMIF) pod may be used instead of the output cassette 158.

Figure 4D:
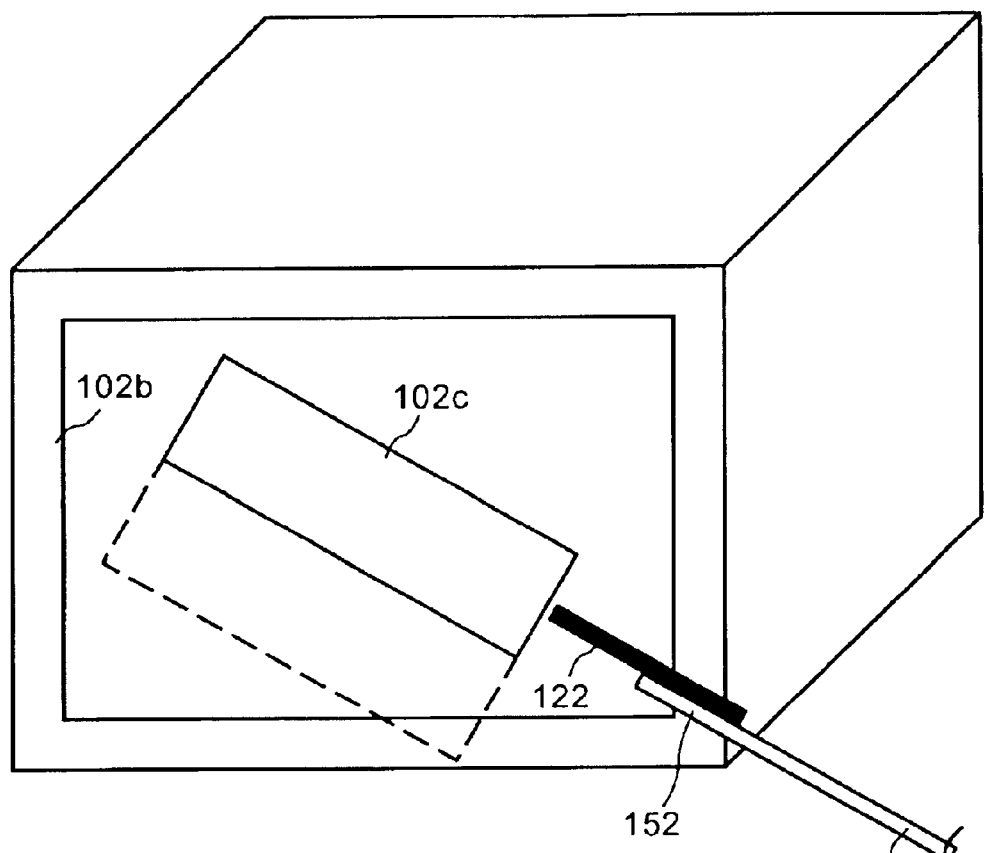
FIG. 4D shows the insertion of a wafer in an insert/process angle into the angular SRD module, in accordance with one embodiment of the present invention.

The insertion of the wafer 122 into the SRD module 100 in an insert/process angle is depicted in FIG. 4D, in accordance with one embodiment of the present invention. As illustrated, a window 102c having an angular orientation is defined in a sidewall 102b of the enclosure 102 thus allowing an end effector 152 to efficiently insert the wafer 122 into the SRD module in the insert/process angle. As the end effector approaches the SRD module, the window 102c is pushed down so as to clear the path for the end effector 152 to insert the wafer 122 to be processed. Defining the window 102c in an angular orientation beneficially reduces the number of movements the end effector 152 must make to load and unload the wafer 122. Specifically, this is possible due to each of the window 102c, the wafer 122 being inserted, and the end effector 152 creating an angle with the horizontal plane that is substantially equivalent to that formed between the wafer process plane and the horizontal plane (i.e., process angle $\theta$).

Although in these embodiments an end effector has been used to load/unload the wafer 122 to/from rollers, it must be appreciated by one of ordinary skill in the art that other equivalent mechanism may be used so long as the functionof loading and unloading of the wafer 122 to the first and second drive rollers 120a and 120b is achieved.

Figure 5:
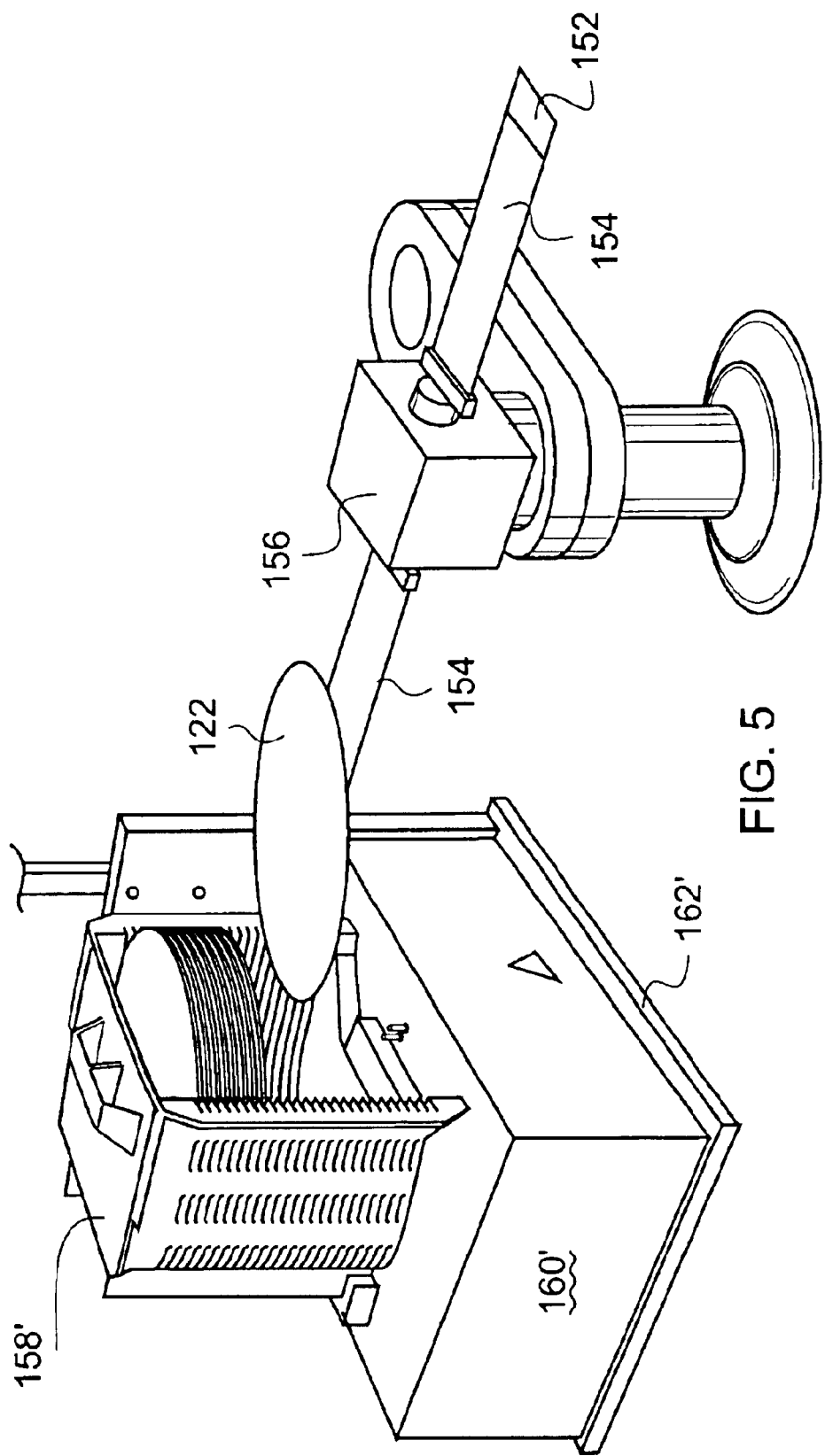
FIG. 5 is an illustration of an end effector transferring a processed wafer into a standard mechanical interface (SMIF) pod, in accordance with one embodiment of the present invention.

In one exemplary embodiment, as shown in FIG. 5, the end effector 152 is configured to unload the clean wafer 122 to a standard mechanical interface (SMIF) pod 159. As illustrated, the SMIF pod 159 includes an output cassette 158' positioned on a base 160' defined over an output shelf 162'. In this manner, once the SMIF pod 159 is full of clean wafers 122, the output shelf 162' is lowered, a cover is attached to the SMIF pod 159, thus maintaining the clean wafers 122 in a clean environment.

For additional information on the loading and unloading of wafers implementing end effectors and SMIF pods, reference can be made to: U.S. patent application Ser. No. 09/687,622, filed on Oct. 12, 2000, having inventors David T. Frost, Oliver David Jones, and Mike Wallis, and entitled "SUBSTRATE PROCESSING IN AN IMMERSION, SCRUB AND DRY SYSTEM." This U.S. Patent Application, which is assigned to Lam Research Corporation, the assignee of the subject application, is incorporated herein by reference.

Figure 6:
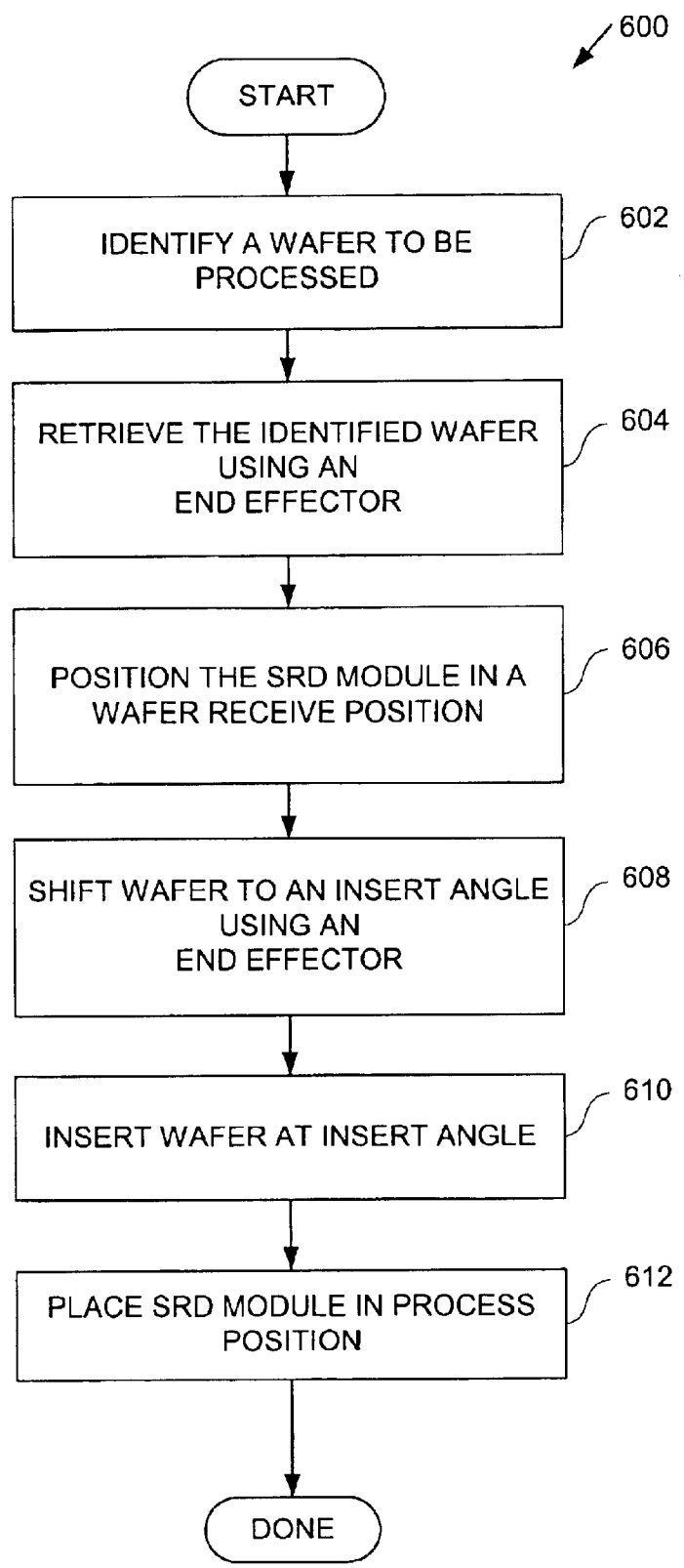
FIG. 6 is a flowchart depicting a method operations performed in processing a wafer in an angular SRD module, in accordance with one aspect of the present invention.

Referring now to the flow chart diagram 600 of FIG. 6, illustrating a method operations performed in processing a wafer in an angular SRD module, in accordance with one implementation of the present invention. The method begins at operation 602 in which a wafer to be processed in the angular SRD module is identified. Then, in operation 604 the identified wafer is retrieved using an end effector. Subsequently, in operation 606 the SRD module is positioned in a wafer receive position. For instance, in one embodiment, a window defined in an angle within a sidewall of the SRD module is pulled down, thus creating an insert path for the end effector. In addition to the window being opened, a retractable engaging roller defined at a process plane within the SRD module is pulled, thus moving the engaging roller out of the position and out of the end effector path.

Continuing to operation 608, the end effector shifts the retrieved wafer so as to assume an insert angle. Preferably, the insert angle is substantially equivalent to the process angle, thus reducing the number of movements the end effector must make to insert the wafer. Thereafter, in operation 610, the wafer to be processed is inserted into the SRD module at the insert angle. Finally, in operation 612, the SRD module is placed in the process position. That is, the engaging roller that was initially moved out of position so as to provide clearance for the loading of the wafer is released to return to its initial position.

Figure 7:
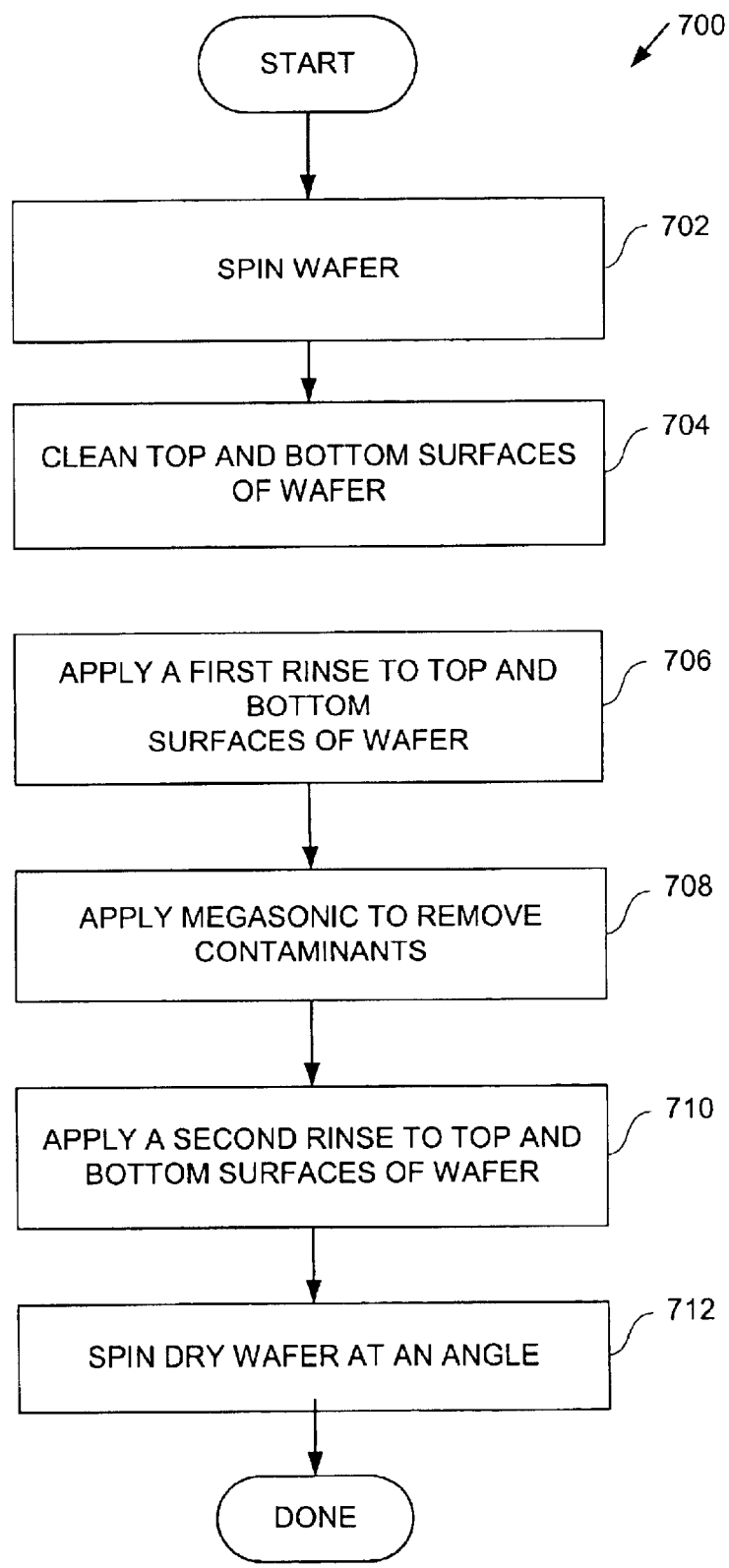
FIG. 7 is a flowchart illustrating a method operations for processing a wafer in an angular SRD module, in accordance with yet another aspect of the present invention.

Reference is now made to flow chart 700 illustrated in FIG. 7 showing a method operations for processing a wafer in an angular SRD module, in accordance with one embodiment of the present invention. The method 700 starts at an operation 702 in which the wafer is spun at an angle followed by an operation 704 wherein the top and bottom surfaces of the wafer are cleaned. As described in detail with respect to FIG. 1, the cleaning of the wafer is performed using a cleaning dispenser configured to apply cleaning solution onto both top and bottom surfaces of the wafer being spun. Preferably, the cleaning operation is configured to dislodge, loosen, and remove particulate contaminants, residues, and chemicals remained on the top and bottom surfaces of the wafer.

Subsequently, in operation 706, the top and bottom surfaces of the wafer are rinsed for the first time. Thereafter, the method continues to operation 708, in which megasonic is applied onto the top and bottom surfaces of the wafer. Preferably, megasonic is applied to dislodge, loosen, and remove finer particulate contaminants, residues, and chemicals remaining on the top and bottom surfaces of the wafer subsequent to the cleaning operation. Then, a second rinse is applied to the top and bottom surfaces of the wafer in operation 710. Finally, in operation 712, the wafer is dried by being spun at an angle. In preferred embodiments, the drying of the wafer is expedited using the help of dry assist mechanism described in detail with respect to FIG. 1.

Figure 8:
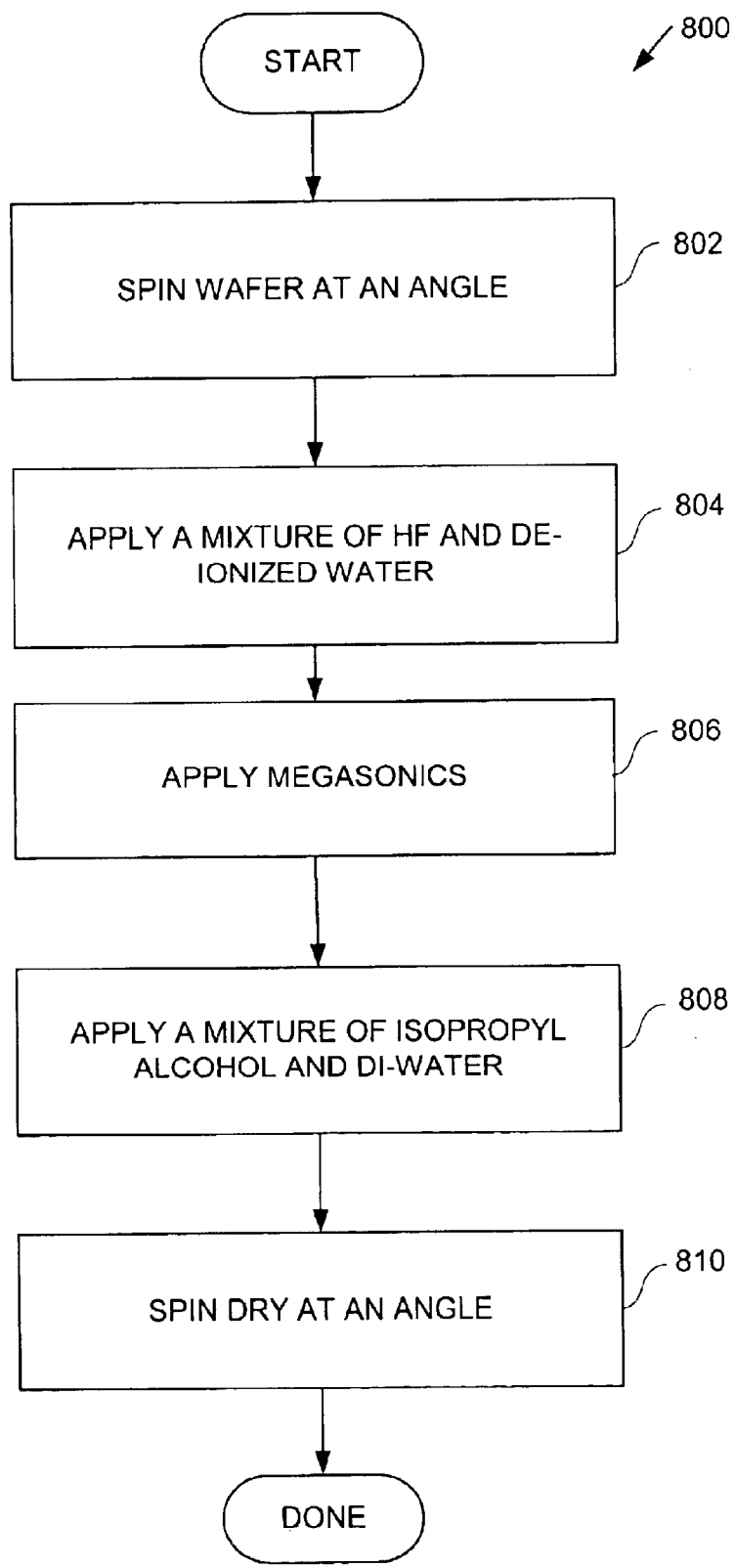
FIG. 8 is a flow chart showing the method operations in cleaning a wafer in an angular SRD module, in accordance with another aspect of the present invention.

The method operations in cleaning a wafer according to one embodiment of the present invention is shown in flow chart 800 of FIG. 8. As illustrated, the method 800 beings in operation 802 in which a wafer is spun at an angle followed by cleaning the top and bottom surfaces of the wafer by applying a mixture of hydrofluoric acid (HF) and de-ionized water in operation 804. Preferably, the concentration of the HF in the mixture of hydrofluoric acid (HF) and de-ionized water ranges from approximately about 1% to approximately about 2%.

Continuing to operation 806 megasonics is applied onto the top and bottom surfaces of the wafer. Subsequently, a mixture of isopropyl alcohol and di-water is applied onto the top and bottom surfaces of the wafer in operation 808. Finally, in operation 810, the wafer is spun dry at angle.

Figure 9:
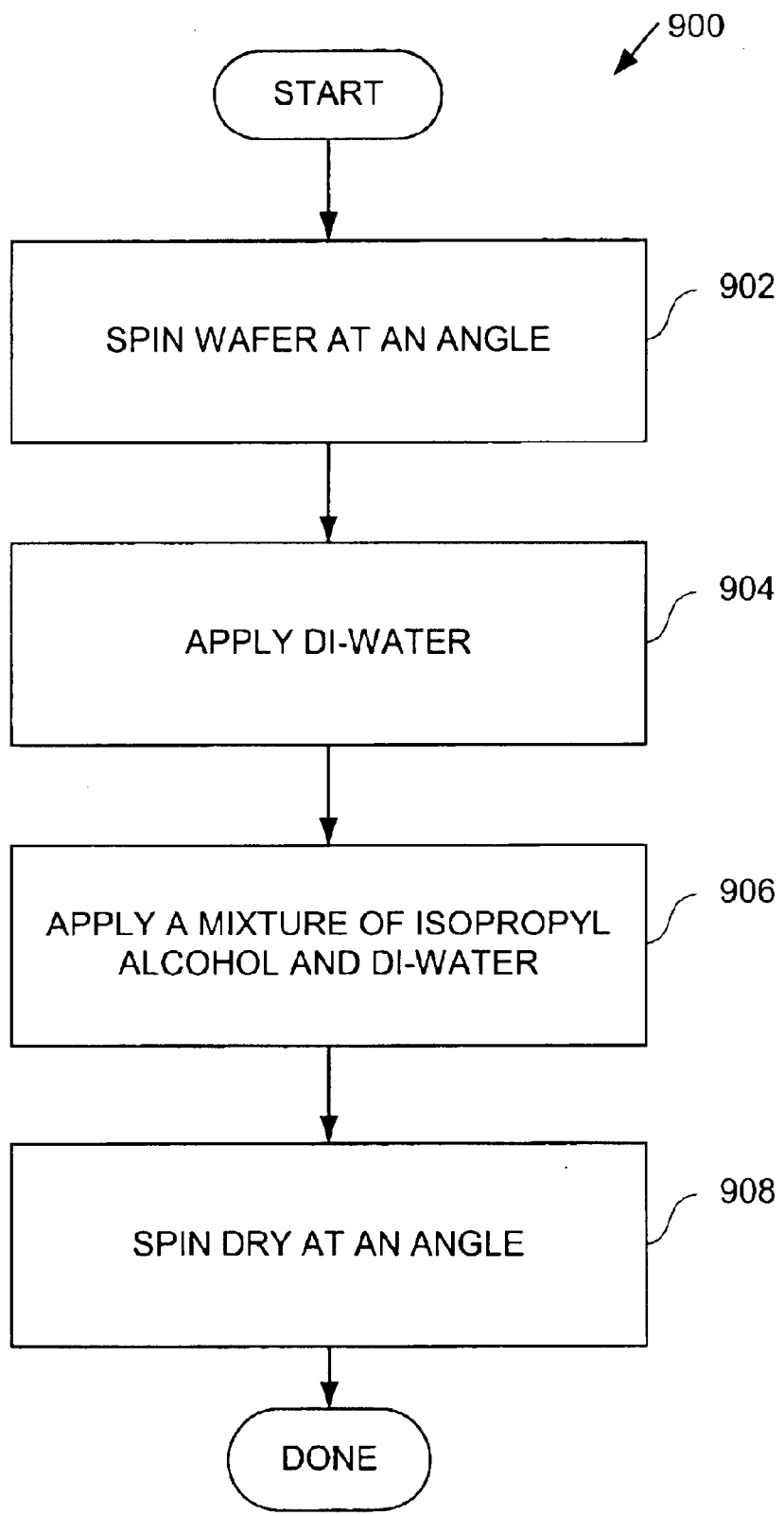
FIG. 9 is a flow chart illustrating a method operations for cleaning a wafer in an angular spin, dry, and rinse module, in accordance with still another aspect of the present invention.

Flow chart 900 of FIG. 9 shows a method operations for cleaning a wafer in an angular spin, dry, and rinse module, in accordance with another embodiment of the present invention. The cleaning method 900 starts in operation 902 in which wafer is spun at an angle followed by applying of di-water to the top and bottom surfaces of the wafer in operation 904. Then, in operation 906 the top and bottom surfaces of the wafer are rinsed by applying a mixture of isopropyl alcohol and di-water. Finally, in operation 908, the wafer is spun dry at angle.

Figure 10:
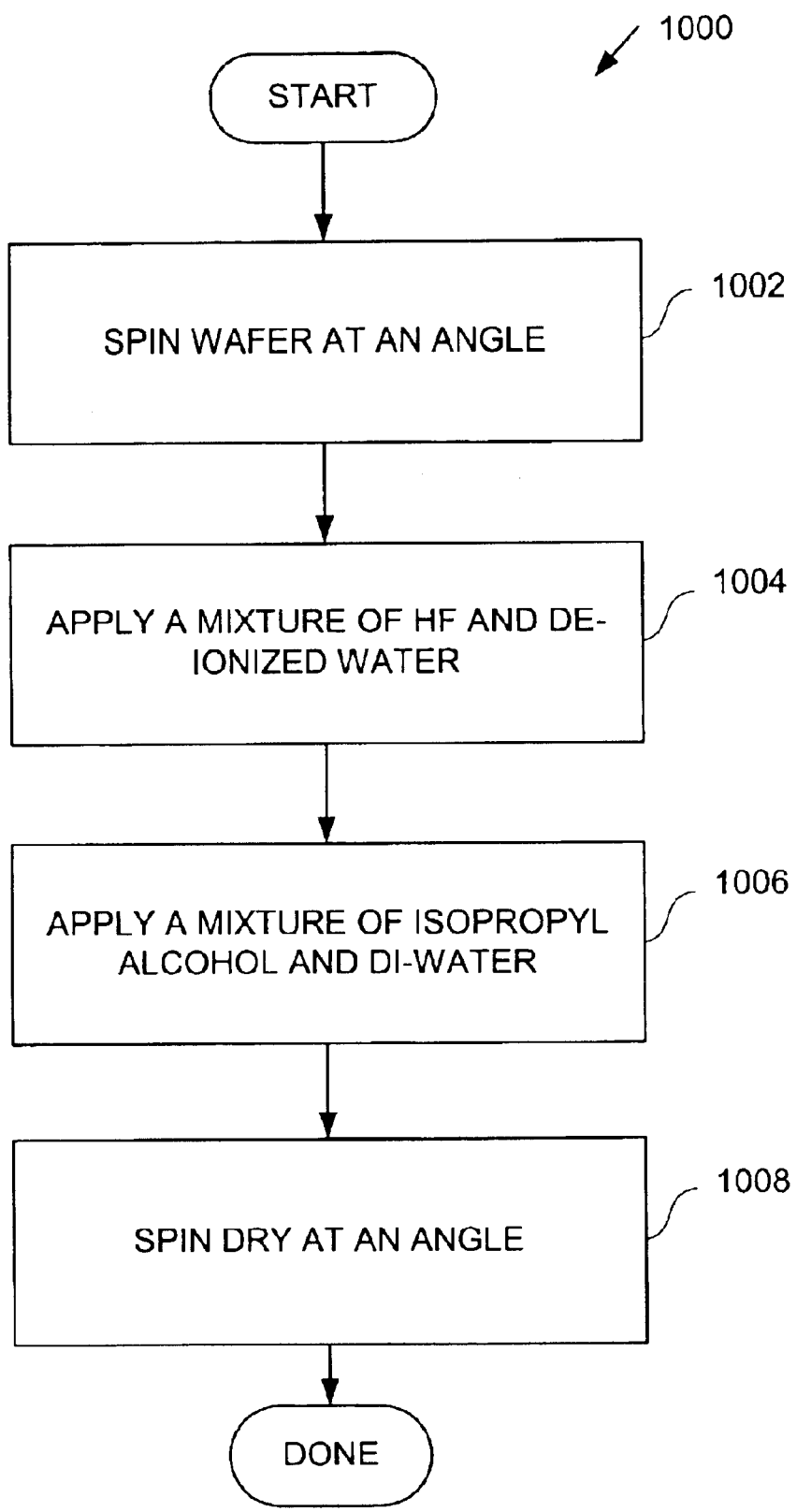
FIG. 10 is a flow chart illustrating the method operations in cleaning a wafer in an angular SRD module, in accordance with yet another aspect of the present invention.

The method operations in cleaning a wafer according to yet another embodiment of the present invention is shown in Flow chart 1000 of FIG. 10. The cleaning method 1000 starts in operation 1002 in which wafer is spun at an angle followed by rinsing of the top and bottom surfaces of the wafer with a mixture of hydrofluoric acid (HF) and de-ionized water in operation 1004. Then, in operation 1006 the top and bottom surfaces of the wafer are rinsed by applying a mixture of isopropyl alcohol and di-water. Finally, in operation 1008, the wafer is spun dry at angle.

As illustrated in the method operations 600–1000, the spin, rinse, and drying of a wafer at an angle while the wafer is engaged and spun by rollers is beneficial as the number of end effector movements required to load and unload wafers are reduced. Additionally, the drying of the wafer is expedited using non-destructive substantially low RPMs. Furthermore, using rollers to engage the wafer significantly reduces the size of the SRD module while it ensures the cleaning of both the top and bottom surfaces of the wafer.

Although the foregoing invention has been described in some detail for purposes of clarity of understanding, it will be apparent that certain changes and modifications may be practiced within the scope of the appended claims. For example, embodiments described herein have been primarily directed toward spinning, rinsing, and drying (SRD) wafers; however, it should be understood that the angular SRD module of the present invention is well suited for spin rinsing of any type of substrate. Furthermore, it should be understood that the angular SRD module of the present invention is well suited for spin rinsing of any size wafer or substrate, such as hard disks, if desired. Additionally, the embodiments of the present invention have implemented a motor to rotate the drive rollers and an air-cylinder to relocate the engaging roller, it must be appreciated by one of ordinary skill in the art that any appropriate device capable of performing these functions may be used. Accordingly, the present embodiments are to be considered as illustrative and not restrictive, and the invention is not to be limited to the details given herein, but may be modified within the scope and equivalents of the appended claims.

What is claimed is:

1. A spin, rinse, and dry module comprising:
    an enclosure having an outer wall, the outerwall being configured to include a window therein, the window being defined within the outerwall so as to create a process angle with a horizontal plane;
    a pair of drive rollers defined within the enclosure, the drive rollers being configured to spin a substrate to be processed while engaging the substrate to be processed; and
    an engaging roller defined within the enclosure, the engaging roller configured to engage the substrate to be processed, the engaging roller and the pair of drive rollers configured to engage the substrate to be processed such that the substrate to be processed creates an angle with the horizontal plane that is substantially equivalent to the process angle.

2. A spin, rinse, and dry module as recited in claim 1, further comprising:
    a cleaner dispenser defined within the enclosure, the cleaner dispenser being configured to clean a top surface and a bottom surface of the substrate to be processed.

3. A spin, rinse, and dry module as recited in claim 1, further comprising:
    a megasonic assembly defined within the enclosure, the megasonic assembly being configured to be applied to a top surface and a bottom surface of the substrate to be processed.

4. A spin, rinse, and dry module as recited in claim 1, further comprising:
    a plurality of gas blow nozzles defined within an inner wall of the enclosure, at least one gas blow nozzle being configured to dispense a first gas onto each of the drive rollers and the engaging roller.

5. A spin, rinse, and dry module as recited in claim 1, further comprising:

a plurality of holes defined within an inner wall of the enclosure so as to introduce a second gas into the enclosure, the second gas being configured to substantially evenly dry a top surface and a bottom surface of the substrate to be processed.

6. A wafer preparation module, comprising:

an enclosure containing wafer engaging rollers, the wafer engaging rollers being oriented at an angle, the wafer engaging rollers designed to spin a wafer at an angle during preparation; and a nozzle configured to apply a gas flow toward at least one of wafer engaging rollers.

7. A wafer preparation module as recited in claim 6, further comprising:

at least one cleaner dispenser configured to apply a fluid to a surface of the wafer during at least part of the preparation.

8. A wafer preparation module as recited in claim 6, further comprising:

a megasonic spray assembly for applying a megasonic spray to a surface of the wafer.

9. A wafer preparation module as recited in claim 6, wherein at least one of the wafer engaging rollers is a drive roller.

10. A spin, rinse, and dry module comprising:

an enclosure having an outer wall, the outerwall being configured to include a window therein, the window being defined within the outerwall so as to create a process angle with a horizontal plane;

a pair of drive rollers defined within the enclosure, the drive rollers being configured to spin a substrate to be processed while engaging the substrate to be processed;

an engaging roller defined within the enclosure, the engaging roller configured to engage the substrate to be processed, the engaging roller and the pair of drive rollers configured to engage the substrate to be processed such that the substrate to be processed creates an angle with the horizontal plane that is substantially equivalent to the process angle; and a plurality of gas blow nozzles defined within an inner wall of the enclosure, at least one gas blow nozzle being configured to dispense a first gas onto each of the drive rollers and the engaging roller.

11. A spin, rinse, and dry module comprising:

an enclosure having an outer wall, the outerwall being configured to include a window therein, the window being defined within the outerwall so as to create a process angle with a horizontal plane;

a pair of drive rollers defined within the enclosure, the drive rollers being configured to spin a substrate to be processed while engaging the substrate to be processed;

an engaging roller defined within the enclosure, the engaging roller configured to engage the substrate to be processed, the engaging roller and the pair of drive rollers configured to engage the substrate to be processed such that the substrate to be processed creates an angle with the horizontal plane that is substantially equivalent to the process angle; and a plurality of holes defined within an inner wall of the enclosure so as to introduce a second gas into the enclosure, the second gas being configured to substantially evenly dry a top surface and a bottom surface of the substrate to be processed.

12. A wafer preparation module, comprising:

an enclosure containing wafer engaging rollers, the wafer engaging rollers being suspended at an angle, the wafer engaging rollers designed to spin a wafer at an angle during preparation, the enclosure further having an inner wall containing a plurality of holes defined therein, the plurality of holes being configured to introduce a gas into the enclosure, the gas being configured to substantially evenly dry a top surface and a bottom surface of the wafer to be processed.

13. A wafer preparation module as recited in claim 12, wherein the preparation includes one of rinsing, cleaning, drying, scrubbing, and megasonic fluid application.

14. A wafer preparation module as recited in claim 12, further comprising:

a nozzle configured to apply a gas flow toward at least one of wafer engaging rollers.

* * * * *